United States Patent
Moreno García-Loygorri et al.

(10) Patent No.: US 11,376,965 B2
(45) Date of Patent: Jul. 5, 2022

(54) MONITORING DEVICE FOR MONITORING CATENARY-PANTOGRAPH INTERACTION IN RAILWAY VEHICLES

(71) Applicant: METRO DE MADRID, S.A., Madrid (ES)

(72) Inventors: Juan Moreno García-Loygorri, Madrid (ES); Julián Martín Jarillo, Madrid (ES)

(73) Assignee: METRO DE MADRID, S.A., Madrid (ES)

( * ) Notice: Subject to any disclaimer, the term of this patent is extended or adjusted under 35 U.S.C. 154(b) by 368 days.

(21) Appl. No.: 16/710,730

(22) Filed: Dec. 11, 2019

(65) Prior Publication Data

US 2020/0189393 A1 Jun. 18, 2020

(30) Foreign Application Priority Data

Dec. 14, 2018 (EP) .................................... 18382928

(51) Int. Cl.
*B60L 3/00* (2019.01)
*B60L 5/18* (2006.01)
*G01R 31/00* (2006.01)

(52) U.S. Cl.
CPC ............... *B60L 3/0023* (2013.01); *B60L 5/18* (2013.01); *G01R 31/008* (2013.01); *B60L 2200/26* (2013.01)

(58) Field of Classification Search
CPC ...... B60L 3/0023; B60L 5/18; B60L 2200/26; G01R 31/008; G01R 31/12; B61L 15/0081; G01M 17/08

(Continued)

(56) References Cited

U.S. PATENT DOCUMENTS

2016/0233676 A1\* 8/2016 Bosch ........................ H02J 3/14

FOREIGN PATENT DOCUMENTS

CN   105403242 A        3/2016
DE   102006003969   *   8/2007   ............. B61B 10/04

OTHER PUBLICATIONS

Styskara et al. "The operation principles and implementation of automated system for arc disturbances control for AC and DC electrified railway lines." 2015 IEEE. (Year: 2015).\*

(Continued)

*Primary Examiner* — Farhana A Hoque
(74) *Attorney, Agent, or Firm* — Lucas & Mercanti, LLP

(57) ABSTRACT

The present invention relates to a monitoring device for monitoring catenary-pantograph interaction in a railway vehicle (100) comprising a frequency-tunable radio receiver module (2) with its associated antenna (1) for the reception of radio signals (500) emitted by pantograph-catenary interaction in the radio frequency and microwave bands; and a control module (4) for detecting electric arcs (400) in the radio signal (500) received by the radio receiver (2) within at least one of the tuned bands. Information about the detected arcs (400) can be stored in the storage module (3) and used to generate records and/or alarms sent by a communication module (6). The radio receiver module (2) can be accompanied, in an input-output module (9) to facilitate pantograph monitoring and maintenance, by a pantograph current measurement module (8) and an odometry and positioning module (7) to obtain the position and speed of the vehicle.

15 Claims, 2 Drawing Sheets

(58) Field of Classification Search
USPC .......................................................... 324/536
See application file for complete search history.

(56) References Cited

OTHER PUBLICATIONS

Shuangle, Zhao, et al.,"Measurement and Analysis Method of Electromagnetic Signals for DC Arcing Fault," 2017 4th International Conference on Electric Power Equipment, 2017, 4 pages.
Mariscotti, Andrea, et al., "On the characterization of pantograph arc transients on GSM-R antenna," 17th Symposium IMEKO TC 4 Workshop, Sep. 8-10, 2010, 6 pages.
Aenor, "Railway Applications," Spanish Standard, European Standard EN 50317 of Jul. 2002, Mar. 2003, 30 pages.
Aenor, "Railway Applications," Spanish Standard, European Standard EN 50317:2002/A2:2007, Jun. 2007, 12 pages.
Aenor, "Railway Applications," Spanish Standard, European Standard EN 50317:2002/A1 of Nov. 2004, Mar. 2005, 12 pages.
European Search Report for EP 18382928, dated Jun. 14, 2019, 2 pages.
Styskala, Vitezslav et al., "The operation principles and implemntation of automated system for arc disturbances control for AC and DC electrified railway lines," May 20, 2015, 4 pages.
Midya, Surajit et al., "Conducted and Radiated Emission from Pantograph Arcing in AC Traction System," Jul. 26, 2009, 8 pages.
Mariscotti, Andrea et al., "Time and Frequency Characterization of Radiated Disturbances in Telecommunication Bands due to Pantograph Arcing," May 13, 2012, 5 pages.
Midya, Surajit et al., "Understanding Pantograph Arcing in Electrified Railways—Influence of Various Parameters," Aug. 18, 2008, 6 pages.

* cited by examiner

MONITORING DEVICE FOR MONITORING CATENARY-PANTOGRAPH INTERACTION IN RAILWAY VEHICLES

CROSS-REFERENCE TO RELATED APPLICATIONS

The present U.S. non-provisional patent application claims priority benefit to European Patent Application No. 18382928.2, filed on Dec. 14, 2018, and entitled, "MONITORING DEVICE FOR MONITORING CATENARY-PANTOGRAPH INTERACTION IN RAILWAY VEHICLES," whereby the entirety of the above-identified European patent application is hereby incorporated by reference into the present U.S. non-provisional patent application.

OBJECT OF THE INVENTION

The present invention is comprised in the railway transport sector, and more particularly, it is comprised in the field of real-time automatic monitoring of power supply systems of the locomotive vehicles; specifically, of the measurement of the interaction between the overhead conductor line (catenary) and the electrical energy collect mechanism (pantograph).

The present invention thus relates to a device for automatically monitoring the catenary-pantograph interaction in real-time based on measurements in radio frequency bands (including microwaves).

BACKGROUND OF THE INVENTION

In the field of pantograph-catenary contact for supplying energy to electric vehicles, an electric arc is produced between the contact strip and a contact wire of the railway catenary when the current flow goes through the air that separates them. Ideally, the catenary and the pantograph contact strip should not become detached at any time, but in practice this contact is often imperfect. Those imperfections are usually identified easily by intense light emission, particularly in arcs, which are quite visible, and to a lesser extent in the less intense sparks. Logically, for the correct and efficient operation of electrified railway lines it is extremely important for the catenary-pantograph contact to be suitable and for electric arcs not to be generated, since they primarily result in the loss of electric potential in vehicle engines, as well as damage in the catenary, the pantograph contact strip, and the different electrical equipment of substations and trains.

Particularly, the correct pantograph-catenary contact is one of the railway engineering problems harder to fix, since it is affected by a large number of dynamic and static pantograph and catenary parameters, and by the wear of the pantograph contact strips.

One of the primary pantograph settings is the force applied on the catenary. If this force is very high, the wear assumed by pantograph contact strips will be very high, with the subsequent economic impact as well as the impact on rolling stock availability. In contrast, if this force is very low, arcs are frequently produced, with the consequences indicated above. It is, therefore, extremely important to establish a method for the measurement, characterization, and monitoring of this contact, such that the contact force may subsequently be adjusted, which allows optimizing the performance of the current collection system.

Given that the most evident strategy for monitoring this contact is direct visual contact, the sensors used are usually optical sensors (for example, meters for measuring light intensity in the infrared, visible or event ultraviolet spectrum or video cameras).

For example, CN105403242 describes a locomotive pantograph-catenary hard point photoelectric vibration comprehensive GPS detection method. The method includes converting the arc light to electrical signals, analyzing and processing the electrical signals, and analyzing the vibration signals by means of a dynamic model for obtaining a vibration value associated with accurate positioning by means of GPS. CN105403242 uses an ultraviolet light photoelectric sensor, an acceleration sensor, a signal conditioning device, an isolation transformer, an acquisition card, a control computer, a display, a memory, and a GPS positioner.

It is known that there is only one electromagnetic spectrum and it comprises from the extremely low frequency (ELF) band to the X-ray and gamma frequency bands, which have the highest frequencies.

The devices used today for measuring catenary-pantograph interaction either work in the optical range (CCTV or closed-circuit TV cameras, light meters), or in the infrared range (thermal cameras) and even in the ultraviolet range, like in the aforementioned document CN105403242.

In fact, there is a reference standard for the characterization of the catenary-pantograph contact [UNE-EN 50317 standard, "requirements for and validation of condition measurements of dynamic interaction between pantograph and overhead contact lines", January, 2012] which relates exclusively to devices for measuring catenary-pantograph interaction working in the optical band of the spectrum (the standard literally reads as follows: "the detector must be sensitive to wavelengths of the light emitted by copper materials").

To that end, optical sensors have been used to study electric arcs up until now. Of course these sensors present enormous advantages, but also a major drawback: they require as direct line of sight between the sensor itself and the catenary-pantograph contact, which means that the sensor has to be installed on the roof of the train, with the subsequent associated electrical risk. This involves higher installation costs than if it could be arranged in other locations inside the train, for example; this is because it requires shutting off power to access the roof and specialized personnel, in addition to it often being prohibited to wire the roof to the inside of the train (due to the electrical risk), which limits the use of these sensors to the duration of the batteries with which they are provided.

On the other hand, in "On the characterization of pantograph arc transients on GSM-R antenna", by Mariscotti et al. (17th Symposium IMEKO TC 4, 3rd Symposium IMEKO TC 19 and 15th IWADC Workshop Instrumentation for the ICT Era, 2010) and in "Measurement and analysis method of electromagnetic signals for DC arcing fault" by Shuangle et al. (4th International Conference on Electric Power Equipment—Switching Technology, 2017) it is described that in the presence of sparks, arcs, or ionization of the air in general, an electric arc emits electromagnetic (EM) radiation in a broad spectrum of radio frequencies, and it may be modeled like an interference in both DC lines ("Measurement and analysis method of electromagnetic signals for DC arcing fault") and AC lines ("On the characterization of pantograph arc transients on GSM-R antenna").

Conventionally, when these emissions have been studied, it was done for purely academic purposes or for the purpose of characterizing potential interferences with communication systems, as described, for example, in the aforementioned study "On the characterization of pantograph arc transients on GSM-R antenna", by Mariscotti et al., but in no case was it for the purpose of characterizing catenary-pantograph interaction.

Other studies, for example, "Feasibility of Spread Spectrum Sensors for Location of Arcs on Live Wires", by Furse, et al. (IEEE Sensors Journal, pp. 1445-1450, Vol. 5, No. 6, 2005), have proposed sensorizing the spectrum to detect intermittent problems in aircraft electrical wiring, but it is also a completely different application with respect to the measurement of catenary-pantograph interaction in railway vehicles.

Sparks, arcs, etc. can also be observed in other different machines which involve an electric current transmission through a contact (electric motors themselves, for example), with the exception that the diagnostics of that contact is completely different from that of the catenary-pantograph interaction.

The objective technical problem that is presented is to provide a cost-effective and easy-to-install device in any location of a railway vehicle for the measurement, characterization, and monitoring of catenary-pantograph interaction, which identifies and characterizes the scenarios degrading catenary-pantograph contact, such as electric arcs, sparks, etc.

DESCRIPTION OF THE INVENTION

The present invention serves to solve the aforementioned problem by means of a device using at least one measurement sensor working in the radio frequency bands, comprised between a few kHz (i.e., right above audio frequencies) and the near-infrared, and, more particularly, comprising at least one of the frequency high or HF band, the ultra high frequency or UHF band, and the microwave band. Accordingly, the invention is clearly distinguished from the earlier background documents in that it works in other bands of the spectrum (which are not the visible light, X-ray, gamma, infrared, or ultraviolet band), and therefore, it works with other mechanisms for propagating the signal in the air, with different measurement hardware, which requires fewer costs that those required for existing solutions.

Unlike the usual methods of auscultation (cameras or optical devices in general) discussed above, for the present invention to work there does not have to be a direct line of sight (LOS) between the catenary-pantograph contact area and the measurement device measuring the contact, since the operating principle of the sensor is based on measurements in the radio channel.

In the context of the present invention, the imperfect catenary-pantograph contact is modeled as a source of broadband noise or interference in both DC and AC lines. Using a radio receiver, the device herein proposed is capable of detecting electric arcs produced by imperfect contact between the catenary and the pantograph through the measurement of parameters such as: the electromagnetic (EM) radiation power, the time between impulses or arc time, the noise probability distribution, other statistical parameters for probability distribution estimation, etc. Likewise, minor contact defects which do not produce arcs but do produce sparks can also be detected by a duly tuned radio receiver. Given that spectral "footprint" of arcs and the different types of sparks is different, the invention allows characterizing not only catenary-pantograph contact, but also correctly identifying the degraded behavior thereof and obtaining the parameters of the noise distribution associated with radio interference caused by the electric arc.

The device of the present invention acts like an element sensing the radio waves produced by the degraded scenarios, and generally, the catenary-pantograph contact transients.

The device of the present invention comprises a sensor which is a tunable radio receiver for taking a radio meter in one or more configurable frequency bands for handling the regional diversity of frequencies assignments and the variation of catenary voltages, as well as other factors characterizing power supply systems of railway vehicles in each country/region. According to the spectrum sensorization method applied (for example, based on power threshold, waveform, wavelet transform, adapted filtered, etc.), it is considered that there is an electric arc. The device is particularly sensitive to radio emissions that do not come from the electric arcs, therefore:

It does not monitor just one single frequency band, but rather two or more different radio frequency bands that have previously been identified as being related to the spectrum of the electric arcs, such that it is considered that there is an electric arc when a positive and simultaneous detection is made in more than one monitored band. Furthermore, it increases the amount of data to be input into the analysis model.

It carefully selects the monitored radio frequency bands to avoid bands that may be affected by other communication systems or systems of any other type.

In implementations of the invention, the data acquired by the radio receiver can be stored locally or remotely for subsequent use or even for real-time analysis. The acquired data can be digitally processed and reported in real-time or deferred time to provide information, for example, to a remote server, about arcs or imperfections in general of the catenary-pantograph contact (including the position thereof) or to report to an auxiliary train control and management system (TCMS: Train Control & Management System) for the purpose of putting advanced condition-based maintenance (CBM) strategies into practice, or for performing a local real-time diagnosis on the train. The invention allows sending information from the device and optionally also receiving information from remote control systems.

Additionally, can be added a geo-positioning device (for example, GPS receiver) to obtain information about the location of the train in real-time and correlate it with the condition measurements of the catenary-pantograph contact. Therefore, the monitoring device can remotely report, through a wireless communication module, the detection of electric arcs, associating them with the kilometer point of the railway line on which the train is located.

For operation, the measurement device and the entire monitoring assembly can have autonomous power supply equipment or can take supply energy from the power system itself of the railway vehicle.

One aspect of the invention relates to a monitoring device for monitoring catenary-pantograph interaction based on measurements in the radio frequency bands and comprises the following components:

an input and output module with at least one frequency-tunable radio receiver and with its associated antenna for picking up signals emitted by the catenary-pantograph interaction in the radio frequency and microwave bands;

a control module connected to the input and output module configured for detecting electric arcs produced in the catenary-pantograph interaction in the radio signal received by the receiver within at least one of the tuned radio bands.

The advantages of the present invention with respect to the prior state of the art are fundamentally:

- It does not require a direct line of sight between the sensor and the catenary-pantograph contact or the installation of any equipment on the roof of the vehicle or in areas adjacent to the pantograph or other areas generally presenting an electrical risk.
- The volume of the data to be processed or stored is considerably reduced since the needed radio-channel measurements do not have a size comparable to video files used in CCTV camera-based solutions.
- The device is inexpensive and easy to install and maintain, since it basically consists of a radio antenna and a tunable radio receiver for receiving the radio power measurement, and a microcontroller with a data storage unit for processing the measurements. The entire assembly can be supplied through the same power supply system of the train itself or have an autonomous supply (typically a battery).
- The present invention allows obtaining information about the catenary and the pantograph facilitating the condition-based maintenance (CBM) thereof, which is advantageous compared to the solutions from the state of the art prior to the invention, since it is very difficult to perform CBM with cameras aimed at the pantograph.

BRIEF DESCRIPTION OF THE DRAWINGS

A set of drawings is very briefly described below which help to better understand the invention and are directly related to an embodiment of said invention presented as a non-limiting example thereof.

PREFERRED EMBODIMENT OF THE INVENTION

Figure 1:
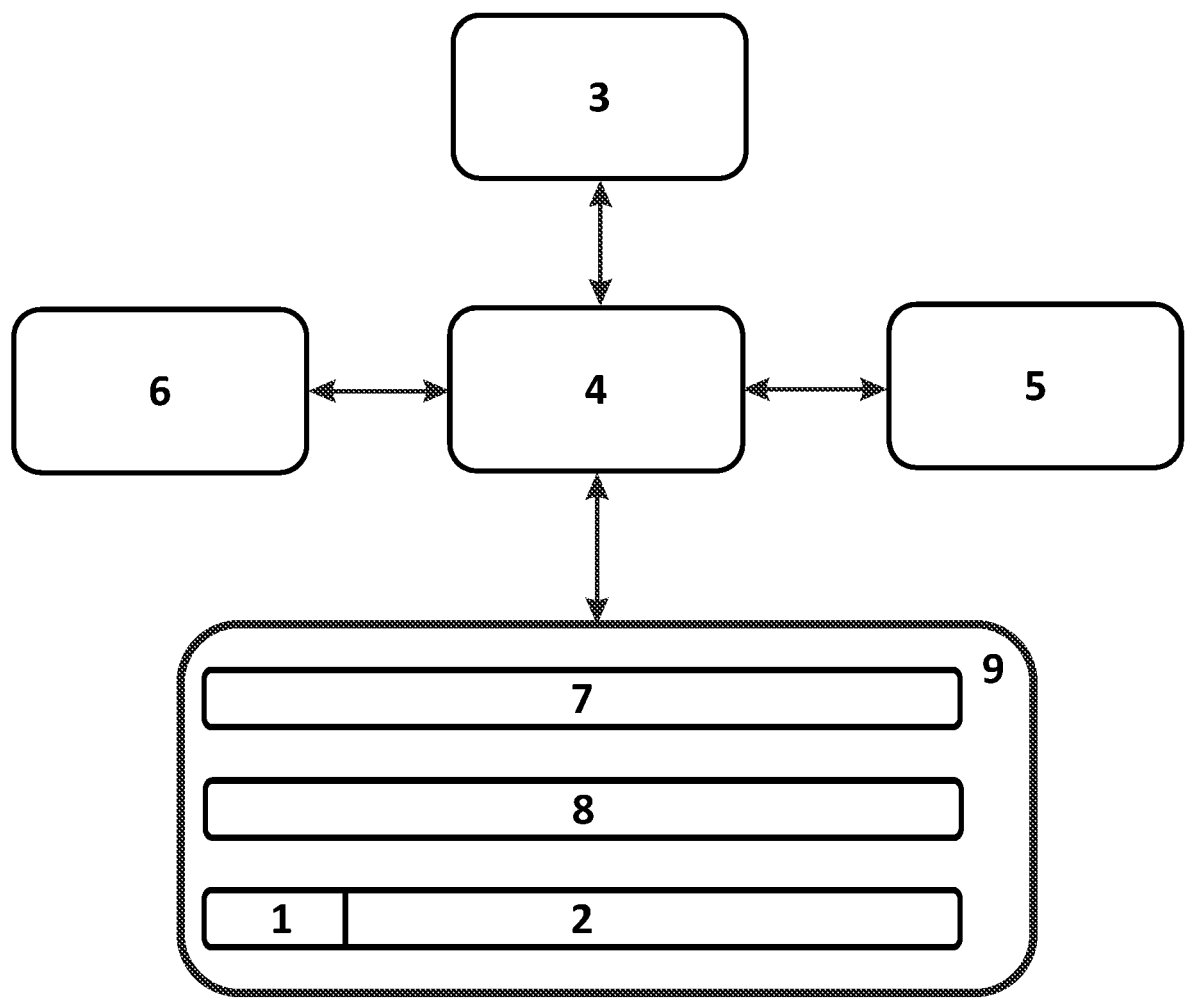
FIG. 1 shows a block diagram of the device for monitoring catenary-pantograph interaction based on measurements in the radio frequency bands, according to a preferred embodiment of the invention.

FIG. 1 shows a possible embodiment of the monitoring device for monitoring catenary-pantograph interaction in a railway vehicle (100). The monitoring device comprises an input/output module (9) comprising at least one frequency-tunable radio receiver module (2) and being complemented with an antenna (1) for picking up radio signals (500) in the radio frequency band, within the range of 20 KHz to 12 GHz. The radio module (2) thereby takes the measurement in the pre-tuned band or bands; preferably in more than one band since, even though the electric arcs (400) have a given frequency response, there can be radio transmission in given bands (due to radio communication systems emissions) which would render the use of the radio for detecting arcs (400) in those same bands impracticable.

Figure 2:
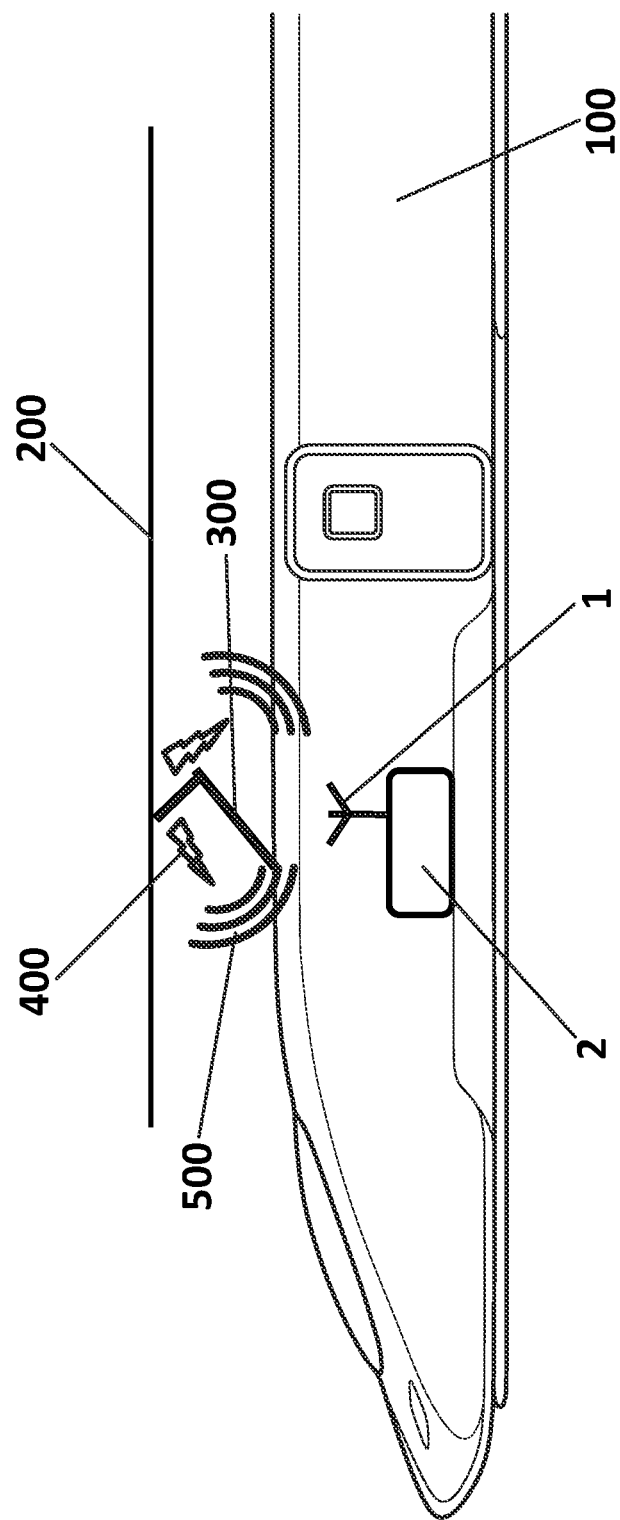
FIG. 2 shows an example of the location of the monitoring device for monitoring catenary-pantograph interaction in a railway vehicle, according to a possible embodiment of the invention.

FIG. 2 shows a possible location of the monitoring device inside the railway vehicle (100), since the radio receiver module (2) is capable of picking up radio signals (500) through its antenna (1) without needing, unlike what is required by solutions from the prior state of the art, the device to be installed in the roof of the vehicle (100) or in the line of sight with the assembly formed by the catenary (200) in contact with the pantograph (300).

The monitoring device, like a concentrating device, makes use of a control module (4) which acts like a central processing unit for the input-output module (9), as well as for the integration with other external systems. The control module (4) may comprise at least one microcontroller, although other alternatives are allowable, such as the combination of a microcontroller (for the real-time data management) and a microprocessor (for local processing), or even a single microprocessor, depending on the chosen operating mode. The control module (4) is locally or remotely connected to the input-output module (9) comprising the radio receiver (2) and the antenna (1).

The monitoring device allows for three possible operating modes, which are the following:

1) Recorder mode, for the subsequent (deferred) downloading of data records.
2) Connected mode, with the automatic downloading of (raw or processed) records to a remote server. In this case, a communication interface (for example, Ethernet or WiFi or 3G/4G) is required to download the data.
3) Alarmed mode, in which it only reports when an electric arc (400) or any other parameter from which the threshold thereof has been defined. In this case, the device performs local processing, so it requires an interface with the system to which the alarms are reported.

For any of those operating modes, the monitoring device comprises a storage module (3), which can be connected locally (typically configured for a circular buffer, such that older records are overwritten) or be in another location of the vehicle (100), for storing the (raw or processed) measurements. Furthermore, the monitoring device comprises a communication module (6), which may be mobile or wireless (for example, Wi-Fi) or use Ethernet or the train communication networks (TCN), etc. Through the communication module (6) the monitoring device sends the records and/or alarms to a receiving center (typically, a server in the operative control or maintenance center of the railway line).

If the power measurement of the radio signal (500) picked up by the antenna (1) is integrated in a concentrator onboard the railway vehicle (100) with the other signals specified for vehicles of this type in EN 50317 standard, which establishes that the presence of arcs (400), i.e., the presence of current of the pantograph (300), must be associated with the speed of the vehicle and with its location on the line, an odometry and positioning module (7) responsible for generating these variables (position and speed of the vehicle) is included in the input-output module (9) of the monitoring device of FIG. 1. To determine the position of the train, the odometry and positioning module (7) can use a GPS receiver or similar, or integrate the speed signal available in the onboard network after a known reference kilometer point. The speed signal of the vehicle can be obtained through the GPS receiver or by connecting the speed signal of the train or locomotive to the control module (4). This speed signal is usually available onboard mobile material in the form of an analog electric signal or in the TCN of the train. It must be noted that even though integration is undoubtedly simpler, it is not always possible to use the GPS signal or the like in railway lines (for example, subway lines usually almost entirely go through tunnels, where this GPS signal does not exist), so other alternative technologies must be used.

EN 50317 standard establishes that for the measurement of catenary-pantograph interaction, it is necessary to measure the elevation of the current wire and/or the pantograph-catenary contact force, or the percentage of time in which electric arcs (400) are formed in said contact or arc percentage, NQ. The arc percentage, NQ, is calculated according to the following expression:

$$NQ = \frac{\sum t_{arc}}{t_{total}} 100\%$$

where $t_{arc}$ is the arc time, i.e., the time each of the recorded electric arcs (400) lasts, and $t_{total}$ is the total measurement time minus the periods in which the current is less than 30% the rated current. Accordingly, by measuring arc time $t_{arc}$ picked up by the radio receiver module (2), it is possible to take a measurement of the arc percentage NQ parameter as established in the mentioned standard.

It is likewise possible to be more accurate in processing the radio signal (500) and applying more advanced techniques, such that it is possible to obtain higher-order statistics (Kurtosis analysis, etc.), or analysis of radio signal spectrum variations (Cepstrum, etc.) or others (wavelet transform, waveform-based detectors, etc.). Therefore, even though the case the most direct use of the proposed system is to calculate the arc percentage, NQ, it is possible to make use of this device to conduct a more in-depth evaluation of catenary-pantograph interaction, by implementing, for example, condition-based maintenance or CBM techniques.

Given that the EN 50317 standard determines that it is necessary to measure pantograph current, to rule out arcs (400) which are produced when said current is abnormally low, a pantograph current measurement module (8) may be included as part of the input and output module (9). Particularly, this measurement can be taken with amperometric clamps or by means of a connection to the TCN bus of the train or to any similar thereof which contains this variable.

Finally, in order for the device to obtain the energy necessary for the working thereof, a power supply module (5), such as a battery, for example, is included.

The invention claimed is:

1. A monitoring device for monitoring catenary-pantograph interaction in a railway vehicle (100), the device comprising:
   an input-output module (9) comprising at least one frequency-tunable radio receiver module (2) and an antenna (1) associated with the radio receiver module (2) for picking up radio signals (500) emitted by the catenary-pantograph interaction in the radio frequency and microwave bands;
   a control module (4) connected to the input-output module (9) configured to:
      detect DC electric arcs (400) produced in the catenary-pantograph interaction in the radio signal (500) received by radio receiver module (2) within at least one of the tuned radio frequency and microwave bands, and
      calculate the time that each of the detected DC electric arcs (400) lasts.

2. The device according to claim 1, wherein the control module (4) is further configured to:
   detect AC electric arcs (400) produced in the catenary-pantograph interaction in the radio signal (500) received by radio receiver module (2) within at least one of the tuned radio frequency and microwave bands, and
   calculate the time that each of the detected AC electric arcs (400) lasts.

3. The device according to claim 1, wherein the control module (4) comprises at least one microcontroller or at least one microprocessor.

4. The device according to claim 1, wherein the control module (4) is further configured to control the device, centralize communications in the device, sense the radio frequency and microwave spectrum and calculate odometry based on a received speed signal of the railway vehicle (100).

5. The device according to claim 1, it further comprising a storage module (3) connected to the control module (4) for storing information about the detected electric arcs (400).

6. The device according to claim 1, it further comprising a communication module (6) connected to the control module (4) for sending records and/or alarms generated by the control module (4) with information about the detected electric arcs (400).

7. The device according to claim 1, wherein the input-output module (9) further comprises an odometry and positioning module (7) to obtain the position and speed of the railway vehicle (100).

8. The device according to claim 7, wherein the odometry and positioning module (7) comprises a GPS receiver.

9. The device according to claim 1, wherein the input-output module (9) further comprises a pantograph current measurement module (8).

10. The device according to claim 9, wherein the pantograph current measurement module (8) uses amperometric clamps or a communication network connection of the railway vehicle (100) which is an interface to a train communication network, TCN.

11. The device according to claim 1, wherein the radio receiver module (2) is tuned in the high frequency band.

12. The device according to claim 1, wherein the radio receiver module (2) is tuned in the ultra-high frequency band.

13. The device according to claim 1, wherein the radio receiver module (2) is tuned in the microwave band.

14. The device according to claim 1, it further comprising an autonomous power supply module (5).

15. The device according to claim 1, it further comprising a power supply module (5) which obtains electrical energy from the power supply system of the railway vehicle (100).

* * * * *